United States Patent

Sakurai et al.

Patent Number: 6,133,157
Date of Patent: *Oct. 17, 2000

[54] DRY ETCHING METHOD OF A SILICON THIN FILM

[75] Inventors: Takehisa Sakurai, Kusatsu; Hitoshi Ujimasa, Higashiosaka; Katsuhiro Kawai, Yamatotakada; Atsushi Ban, Nara; Masaru Kajitani, Osaka; Mikio Katayama, Ikoma, all of Japan

[73] Assignee: Sharp Kabushike Kaisha, Osaka, Japan

[*] Notice: This patent is subject to a terminal disclaimer.

[21] Appl. No.: 09/119,993

[22] Filed: Jul. 21, 1998

Related U.S. Application Data

[63] Continuation of application No. 08/524,886, Sep. 7, 1995, Pat. No. 5,783,494, which is a continuation of application No. 08/157,938, Nov. 24, 1993, abandoned.

[30] Foreign Application Priority Data

Nov. 30, 1992 [JP] Japan .................................... 4-321023

[51] Int. Cl.[7] .................................................. H01L 21/302
[52] U.S. Cl. .......................... 438/719; 438/689; 438/735
[58] Field of Search ..................... 438/706, 689, 438/733, 738, 735, 737, 719, FOR 120, FOR 393, FOR 401

[56] References Cited

U.S. PATENT DOCUMENTS

| | | |
|---|---|---|
| T101,302 | 12/1981 | Forget et al. . |
| 4,383,885 | 5/1983 | Maydau et al. ........................ 438/719 |
| 4,436,581 | 3/1984 | Okudaira et al. ...................... 438/719 |
| 4,490,209 | 12/1984 | Hartman ................................. 438/695 |
| 4,789,426 | 12/1988 | Pipkin .................................... 438/714 |
| 4,799,991 | 1/1989 | Dockrey ................................ 438/719 |
| 4,992,134 | 2/1991 | Gupta et al. ........................... 438/714 |
| 5,384,009 | 1/1995 | Mak et al. .............................. 438/696 |
| 5,650,342 | 7/1997 | Satoh et al. . |

FOREIGN PATENT DOCUMENTS

| | | |
|---|---|---|
| 56-144542 | 10/1981 | Japan . |
| 3-270223 | 12/1991 | Japan . |
| 4-7822 | 1/1992 | Japan . |
| WO 92/06505 | 4/1992 | WIPO . |

OTHER PUBLICATIONS

Grovenor, C.R.M.; Microelectronic Materials, Institute of Physics Publishing, Bristol, pp. 73–74, Jan. 1989.
Mogab et al., *American Vacuum Society*, "Anisotropic Plasma Etching of Polysilicon", 17:3, pp. 721–730 (1980).
Wolf, *Silicon Processing for the VLSI Era*, vol. 1, Lattice Press, pp. 546–549, 556, 557 (1986).
Partial translation of Notice of Reason for Rejection of corresponding Japanese Patent Application No. 4–321023.
Baldi et al., *Journal of Applied Physics*, "Effects of Doping on Polysilicon Etch Rate in a Fluorine–Containing Plasma", 6, pp. 2221–2225 (1985).
Haller et al., *Journal of Electrochemical Society*, "Selective Wet and Dry Etching of Hydrogenated Amorphous Silicon and Related Materials", 8, pp. 2042–2045 (1988).

*Primary Examiner*—John F. Niebling
*Assistant Examiner*—Christopher Lattin
*Attorney, Agent, or Firm*—David G. Conlin; Linda M. Buckley

[57] ABSTRACT

In a method for selectively etching a second silicon layer of a multilayer structure which includes a first silicon layer and the second silicon layer formed on the first silicon layer and doped with impurities according to the present invention, the second silicon layer is selectively etched by using an etching gas including freon-14 gas and a gas selected from a group composed of hydrogen chloride gas and chloride gas.

7 Claims, 6 Drawing Sheets

DRY ETCHING METHOD OF A SILICON THIN FILM

This application is a continuation of application Ser. No. 08/524,886, filed Sep. 7, 1995 now U.S. Pat. No. 5,783,494, which is a file wrapper continuation application of application Ser. No. 08/157,938, filed Nov. 24, 1993 now abandoned.

BACKGROUND OF THE INVENTION

1. Field of the Invention

The present invention relates to a dry etching method used for a silicon thin film of a thin film transistor which is formed on an insulating film or on a semiconductor substrate, constituting a semiconductor integrated circuit and a liquid crystal display device.

2. Description of the Related Art

A thin film transistor (hereinafter, referred to as a "TFT") is widely used as a switching element in a liquid crystal display device and a semiconductor integrated circuit. An intrinsic silicon thin film (hereinafter, referred to as an "i layer") is used as a semiconductor layer constituting the TFT. A metal film is often used as a source electrode and a drain electrode which constitute the TFT. However, the interface resistance (contact resistance) between the metal film and the i layer is large. Accordingly, in the TFT an $n^+$ silicon thin film (hereinafter referred to as an "$n^+$ layer") having a small resistance is formed as a contact layer between the i layer and the source electrode and between the i layer and the drain electrode, respectively. In the case of forming such a TFT, an i layer and an $n^+$ layer are successively formed and then patterned. Thus, in a step for patterning the $n^+$ layer to form a channel section, it is required to selectively etch the $n^+$ layer. Conventionally, examples of methods for selectively etching an $n^+$ layer include a wet etching method and a dry etching method. The wet etching method uses a solution obtained by diluting a mixed etchant of hydrofluoric acid and nitric acid with water or acetic acid. The dry etching method uses an etching gas obtained by adding oxygen gas to mixed gas of carbon tetrachloride gas and freon-14. However, the wet etching method has raised a problem as follows: When the mixed etchant has a smaller dilution concentration, the etch rate thereof becomes higher, and stains (oxide skins) will be partially generated on a silicon thin film to be etched, degrading the controllability of etching and the uniformity in the etch rate. On the other hand, the dry etching method is superior in the controllability of etching and the uniformity of the etch rate. However, the dry etching method has also a problem in that the use of carbon tetrachloride gas for an etching gas will be prohibited in 1996 because of the freon regulations.

SUMMARY OF THE INVENTION

The present invention has been made to overcome the above-mentioned problems. The present invention has an objective of providing a method for selectively etching an $n^+$ layer by using a gas free from the freon regulation, and a method for etching a silicon thin film with which the etch rate is uniform and etching can be easily regulated.

In a method for selectively etching a second silicon layer of a multilayer structure which includes a first silicon layer and the second silicon layer formed on the first silicon layer and doped with impurities according to the present invention, the second silicon layer is selectively etched by using an etching gas including freon-14 gas and a gas selected from a group composed of hydrogen chloride gas and chloride gas.

In one embodiment of the invention, the first silicon layer is formed of an intrinsic silicon.

In another embodiment of the invention, the impurities doped in the second silicon layer are n-type impurities.

In still another embodiment of the invention, the gas pressure of the etching gas is 400 m Torr or more.

In still another embodiment of the invention, the concentration (mol %) of the freon14 gas against the gross volume of the freon-14 gas and the gas selected from the group composed of the hydrogen chloride gas and the chloride gas is 67% or more.

In still another embodiment of the invention, the etching gas further includes oxygen gas.

In still another embodiment of the invention, the concentration (mol %) of the oxygen gas in the etching gas is 12% or less.

In still another embodiment of the invention, the concentration (mol %) of the freon-14 gas against the etching gas is 58% or more.

In still another embodiment of the invention, an activation energy of the second silicon layer is 0.2 eV or less.

In still another embodiment of the invention, an activation energy of the second silicon layer is 0.1 eV.

Alternatively, a method for fabricating a thin film transistor including a gate electrode, a channel-section semiconductor layer electrically separated from the gate electrode by a gate insulating film, a pair of contact layers having contact with the channel-section semiconductor layer, a source electrode having contact with one of the contact layers, and a drain electrode having contact with the other contact layer according to the present invention comprises steps of: forming an intrinsic silicon layer on the gate insulating film, forming an n type silicon layer on the intrinsic silicon layer, and forming the pair of the contact layers by selectively etching a portion of the n type silicon layer with the use of an etching gas including freon-14 gas and a gas selected from a group composed of hydrogen chloride gas and chloride gas.

In one embodiment of the invention, the gas pressure of the etching gas is 400 m Torr or more.

In another embodiment of the invention, the concentration (mol %) of the freon-14 gas against the gross volume of the freon-14 gas and the gas selected from the group composed of the hydrogen chloride gas and the chloride gas is 67% or more.

In still another embodiment of the invention, the etching gas further includes oxygen gas.

In still another embodiment of the invention, the concentration (mol %) of the oxygen gas in the etching gas is 12% or less.

In still another embodiment of the invention, the concentration (mol %) of the freon-14 gas against the etching gas is 58% or more.

In still another embodiment of the invention, an activation energy of the n type silicon layer is 0.2 eV or less.

In still another embodiment of the invention, an activation energy of the n type silicon layer is 0.1 eV.

Thus, the invention described herein makes possible an advantage of (1) providing a method for etching a silicon thin film by using an etching gas including hydrogen chloride gas and freon-14 gas. The hydrogen chloride gas and the freon-14 gas are free from the freon regulation, so that an $n^+0$ layer can be selectively etched by using such a gas. In this case, the gas pressure of the etching gas is 400 m Torr and the concentration (mol %) of the freon-14 gas against the etching gas is 67% or more. Therefore, etching can be conducted with a satisfactory etching controllability and uniform etch rate.

Further, the invention described herein makes possible an advantage of (2) providing a method for etching with a satisfactory etching controllability, an uniform etch rate, and an increased etch rate while keeping the $n^{30}/i$ selectivity by using an etching gas containing oxygen gas to form a concentration (mol %) of 12% or less, even though the concentration of the etching gas including the hydrogen chloride gas and the freon-14 gas is reduced.

These and other advantages of the present invention will become apparent to those skilled in the art upon reading and understanding the following detailed description with reference to the accompanying figures.

DESCRIPTION OF THE PREFERRED EMBODIMENTS

The present invention will now be described by way of examples, the reference to the accompanying drawings.

Figure 1:
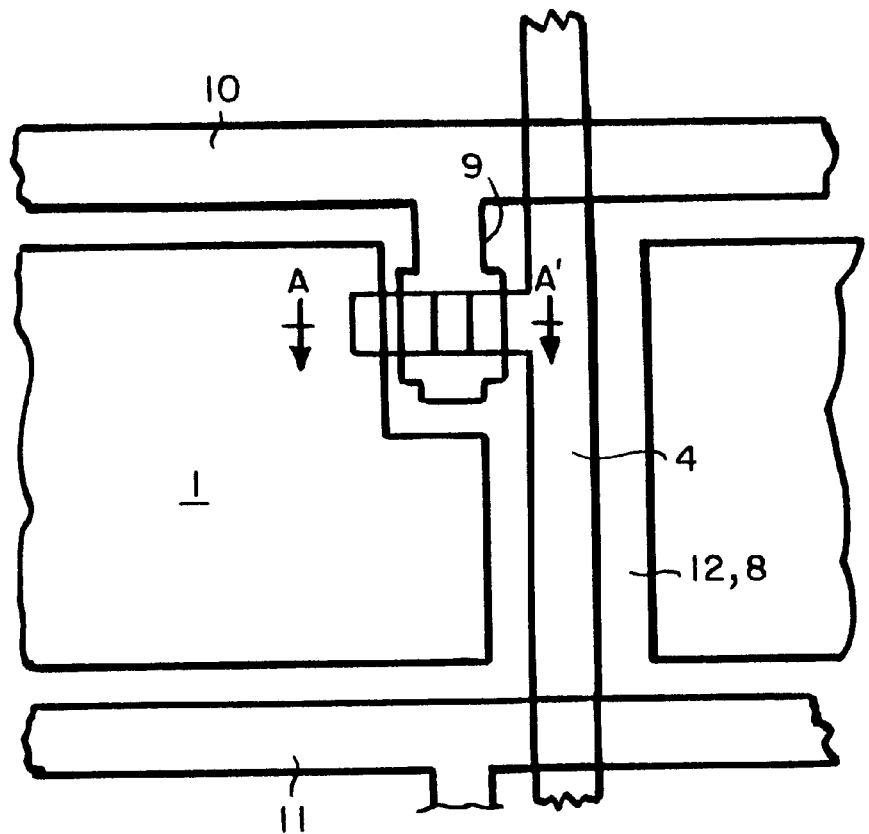
FIG. 1 is a plan view of a TFT formed by a method of the present invention.
Figure 2:
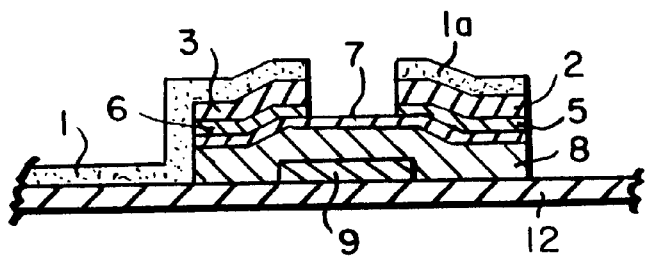
FIG. 2 is a cross-sectional view of the TFT taken along a line A-A' of FIG. 1.

FIGS. 1 and 2 show an example of a TFT fabricated by a method of the present invention. FIG. 1 is a plan view of the TFT, and FIG. 2 is a cross-sectional view of the TFT taken along a line A-A' of FIG. 1.

In the TFT, a gate electrode 9 branched from a gate bus line 10 and an intrinsic silicon thin film layer 7 (hereinafter, referred to as an "i layer") are formed on a base substrate 12 made of a glass plate or the like, sandwiching a gate insulating film 8 therebetween. A source region $n^+$ layer 5 and a drain region $n^+$ layer 6, which are electrically separated from each other, are formed as a contact layer on the i layer 7. A source electrode 2 and a drain electrode 3 are formed on the $n^+$ layers 5 and 6, respectively. A source auxiliary electrode 1a is formed on the source electrode 2 and connected to a source bus line 4. Further, the drain electrode 3 is connected to a pixel electrode 1.

The TFT as mentioned above can be fabricated as follows:

First, a metal thin film or the like is deposited on the base substrate 12 and etched into a desired configuration and size to form the gate bus line 10 and the gate electrode 9. The gate insulating film 8 is formed on the substrate by a CVD method or the like. Then, an intrinsic silicon is deposited on the gate insulating film 8 by the plasma CVD method (hereinafter, referred to as the "PCVD method") to form the i layer 7. Further, silicon doped with n type impurities is deposited on the i layer 7 by the PCVD method or the like to form an $n^+$ layer which will be divided into the $n^+$ layers 5 and 6.

Figure 3:
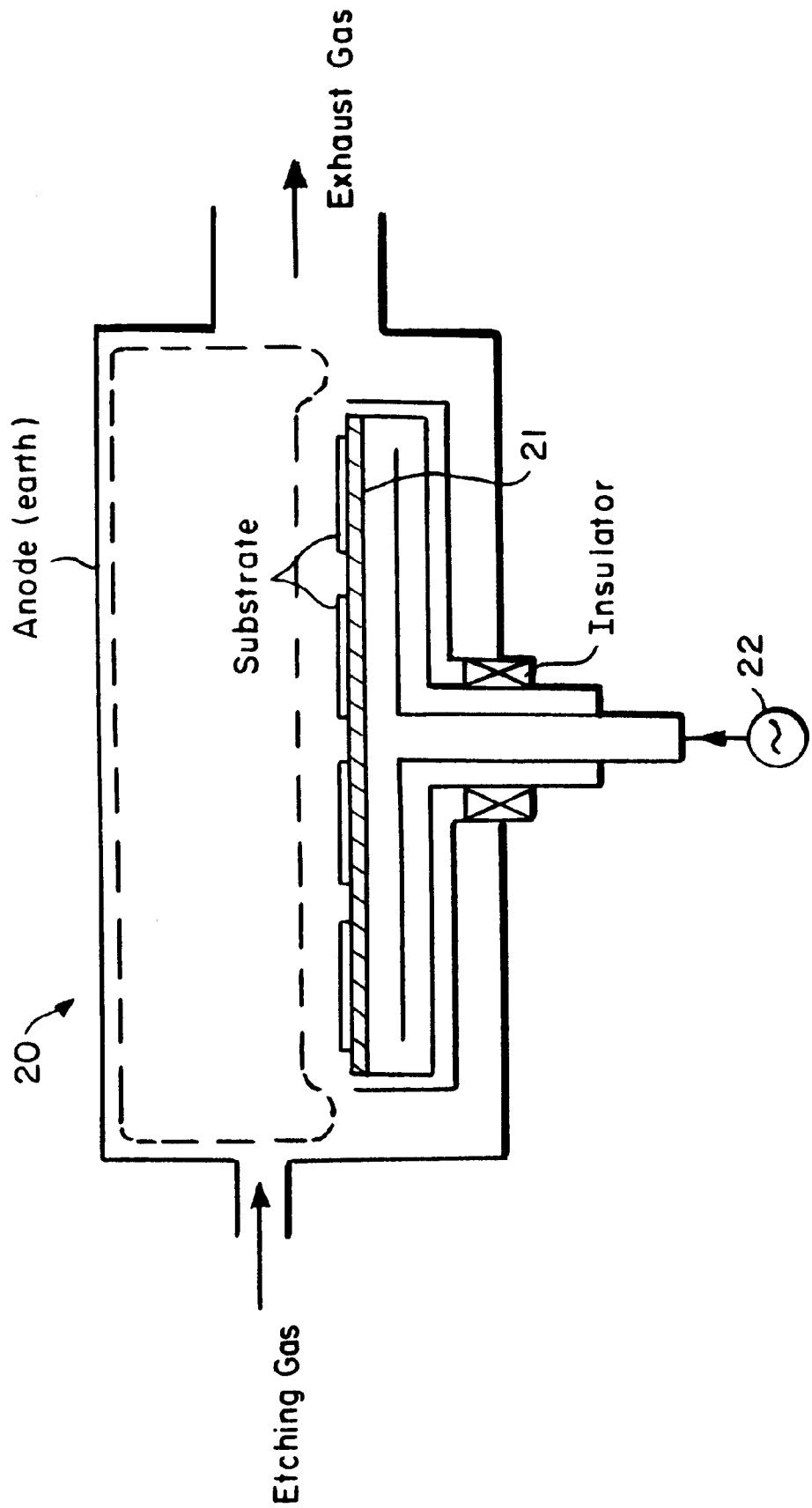
FIG. 3 is a cross-sectional view of an etching apparatus used in an example of the invention.

Subsequently, a step for dividing the $n^+$ layer on the i layer 7 into the source region $n^+$ layer 5 and the drain region $n^+$ layer 6 so as to form the channel section will be described with reference to FIG. 3. In the TFT mentioned above an etching prevention film is not provided on the i layer 7 for simplifying the production steps, so that it is necessary to completely control the selective etching of the $n^+$ layer and the i layer.

First, in a dry etching apparatus 20 of a parallel flat plate type in a RIE (Reactive Ion Etching) mode, substrates each having the i layer and the $n^+$ layer deposited thereon in the above-mentioned manner are provided on a susceptor 21. An etching gas including hydrogen chloride gas (HCl), freon-14 gas ($CF_4$) and oxygen gas ($O_2$) with the flow ratio (Viz. the ratio of the concentration (mol %) in the apparatus 20) of 5:15:2, is injected into the dry etching apparatus so as to have a gas pressure of 400 m-Torr. Then, an electric power having an RF electricity concentration of 0.25 $W/cm^2$ is applied to the susceptor 21 via an RF power supply 22. Silicons of the i layer and the $n^+$ layer react with a reaction species generated in this way to form volatile substances, and then the layers are patterned. The i layer has a higher activation energy then the $n^+$ layer, so that the i layer is less likely to react with the reaction species. Accordingly, it is possible to selectively etch the $n^+$ layer.

The i layer can be patterned as a different step before or after the selective etching.

In the i layer 7, phosphorus may be diffused and an active layer may be formed depending on the temperature at the formation of the $n^+$ layer on the i layer 7 or the thermal hysteresis in other steps. In order to remove the active layer together with the $n^+$ layer by etching, overetching can be used.

The source electrode 2 and the drain electrode 3 are formed on the $n^+$ layers 5 and 6, respectively. Then, a source auxiliary electrode 1a is formed an the source electrode 2 and connected to the source bus 4, and the pixel electrode 1 is connected to the drain electrode 3. Further, a liquid crystal orientation film is entirely formed on the substrate and liquid crystal is sealed between the substrate and a counter substrate, thereby obtaining a liquid crystal display device.

Hereinafter, the results obtained by measuring etching characteristics will be shown, in the case where the etching condition for selectively etching the $n^+$ layer and the i layer is varied.

Figure 4:
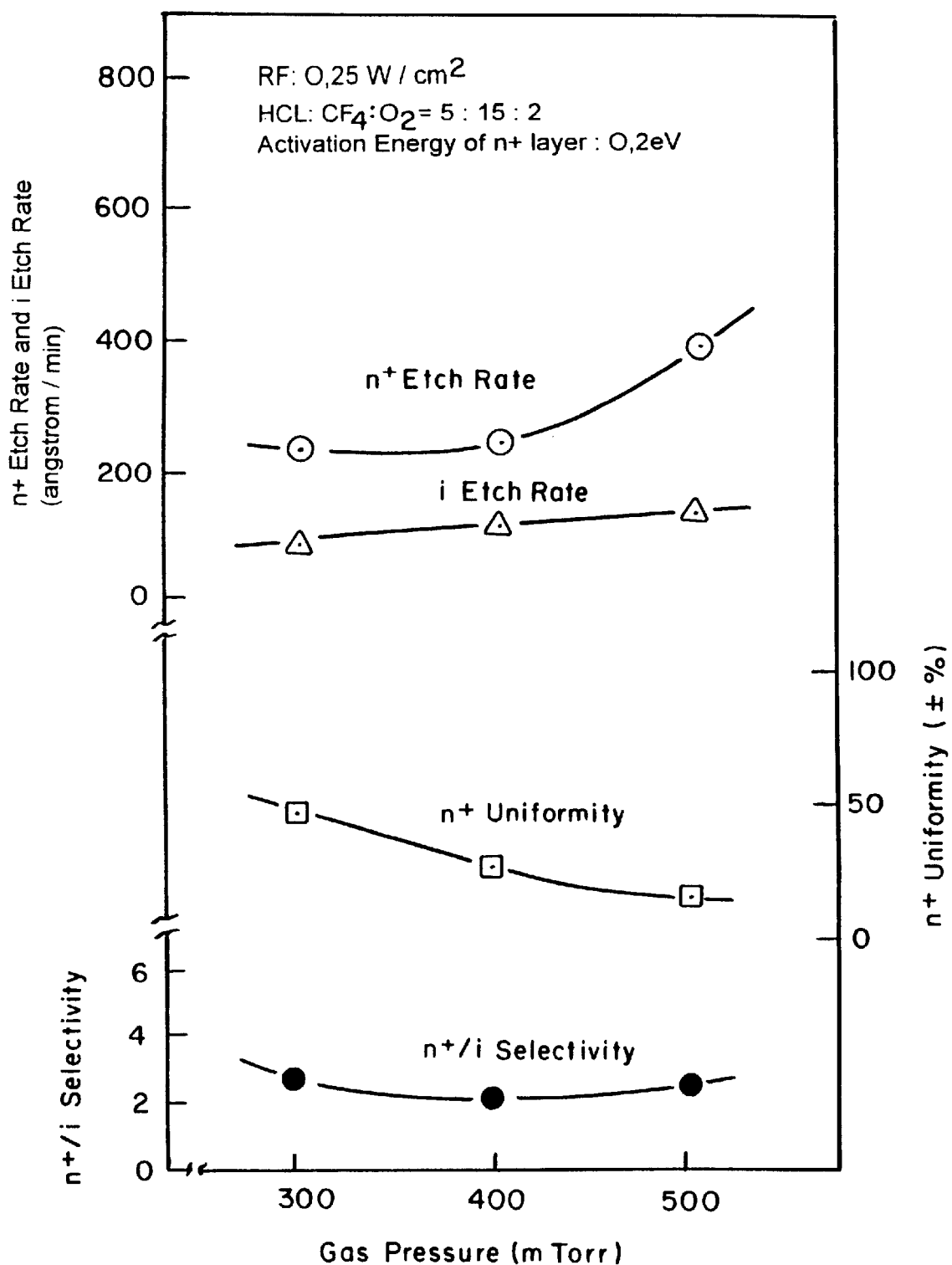
FIG. 4 is a diagram showing dependence of the $n^{30}/i$ selectivity, the uniformity of the etch rate of an $n^+$ layer, and the etch rates of the $n^+$ layer and the i layer, upon the gas pressure, in the case where the i layer and the $n^+$ layer having an activation energy of 0.2 eV are etched by a method of the invention.

FIG. 4 shows the results obtained by measuring the dependence of the $n^+/i$ selectivity, the uniformity of the etch rate of the n$^+$ layer (n$^+$ uniformity), the etch rates of the n$^+$ layer (n$^+$ etch rate) and the i layer (i etch rate), upon the gas pressure, in the case where the i layer and the n$^+$ layer having the activation energy of 0.2 eV are etched by using an etching gas including hydrogen chloride gas, freon-14 gas and oxygen gas with the flow ratio of 5:15:2 at a stable RF electrical density of 0.25 W/cm$^2$.

The n$^+$/i selectivity of a process is a measure of the etch rate of the layer to be etched (n$^+$ layer) relative to other material (i layer) on the wafer surface.

As is understood from this diagram, the uniformity of the etch rate of the n$^+$ layer is decreased (improved) as the gas pressure raises. Further, when the gas pressure is at 400 m Torr or more, the etch rate of the n$^+$ layer sharply increases compared with that of the i layer. When the gas pressure is at 400 m Torr, the n$^+$/i selectivity becomes minimum.

Accordingly, in the case where an etching gas including hydrogen chloride gas, freon-14 gas and oxygen gas is used, the n$^+$/i selectivity, and the uniformity of the etch rate of the n$^+$ layer can be simultaneously improved when the gas pressure is at 400 m Torr or more.

Figure 5:
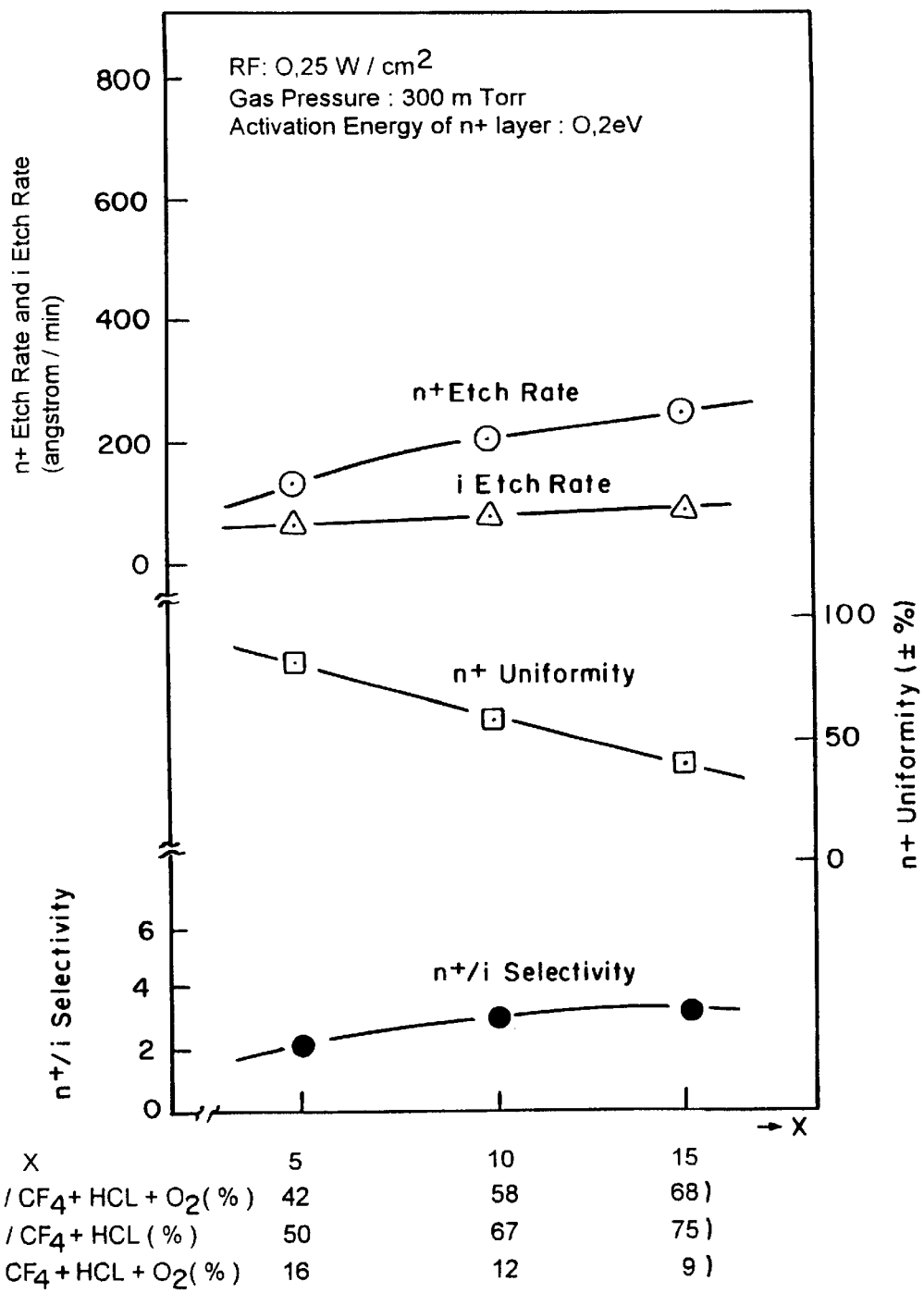
FIG. 5 is a diagram showing dependence of the $n^+/i$ selectivity, the uniformity of the etch rate of an $n^+$ layer, and the etch rates of the $n^+$ layer and the i layer, upon the concentration (mol %) of freon gas in an etching gas, in the case where the i layer and the $n^+$ layer having an activation energy of 0.2 eV are etched by a method of the invention.

FIG. 5 shows the results obtained by measuring the dependence of the n$^+$/i selectivity, the uniformity of etch rate of the n$^+$ layer, and the etch rates of the n$^+$ layer and the i layer, upon the gas concentration of freon-14, in the case where the i layer and the n$^+$ layer having an activation energy of 0.2 eV are etched at a stable gas pressure of the etching gas of 300 m Torr and a stable RF electrical density of 0.25 W/cm$^2$. Herein, the dependence are measured by varying the flow ratio X of freon-14 in an etching gas including hydrogen chloride gas, freon-14 gas, and oxygen gas with the flow ratio of 5:X:2. CF$_4$/CF$_4$+HCl+O$_2$ in this diagram represents the flow ratio (Viz. concentration (mol %)) of freon-14 gas against the gross volume of hydrogen chloride gas, freon-14 gas, and oxygen gas, CF$_4$/CF$_4$+HCl represents the flow ratio of freon-14 gas against the gross volume of hydrogen chloride gas and freon-14 gas, and O$_2$/CF$_4$+HCl+O$_2$ represents the flow ratio of oxygen gas against the gross volume of hydrogen chloride gas, freon-14 gas, and oxygen gas, respectively.

As is understood from FIG. 5, the uniformity of the etch rate of the n$^+$ layer is decreased (improved) as the concentration (mol %) of freon-14 gas is increased and the concentration of oxygen gas is decreased. Further, the n$^+$/i selectivity is small when the flow ratio X of freon-14 gas is 5; and the n$^+$/i selectivity is increased when X is more than 5 and less than 10; and the n$^+$/i selectivity is almost stable when X is 10 or more.

Accordingly, when the concentration (mol %) of freon-14 gas against the gross volume of hydrogen chloride gas and freon-14 gas is 67% or more, the n$^+$/i selectivity and the uniformity of the etch rate of the n$^+$ layer can be simultaneously improved.

Further, when the concentration (mol %) of freon-14 gas against the gross volume of hydrogen chloride, freon-14 gas, and oxygen gas is 58% or more, the n$^+$/i selectivity and the uniformity of the etch rate of the n$^+$ layer can be simultaneously improved.

Further, when the concentration (mol %) of oxygen gas in the etching gas is 12% or less, the n$^+$/i selectivity and the uniformity of the etch rate of the n$^+$ layer can be simultaneously improved.

Figure 6:
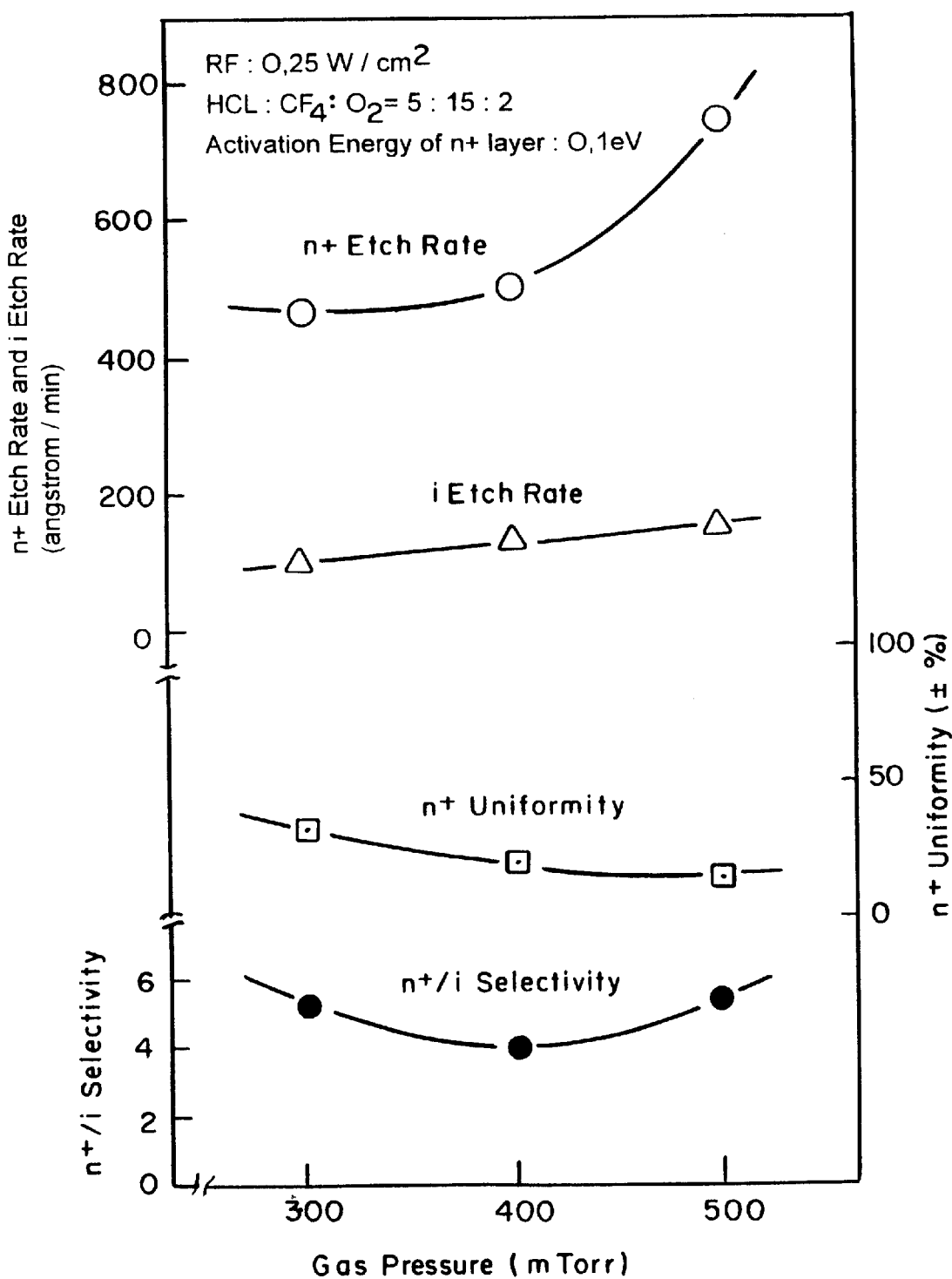
FIG. 6 is a diagram showing dependence of the $n^+/i$ selectivity, the uniformity of the etch rate of an $n^+$ layer, and the etch rates of the $n^+$ layer and the i layer, upon the gas pressure, in the case where the i layer and the $n^+$ layer having an activation energy of 0.1 eV are etched by a method of the invention.

FIG. 6 shows the dependence of n$^+$/i selectivity, the n$^+$ uniformity, and the etch rates of the n$^+$ layer and i layer, upon the gas pressure under the same measurement conditions as those of FIG. 4, except that an n$^+$ layer having an activation energy of 0.1 eV is used.

As is understood from this diagram, the dependence represent the same tendencies as those of a case where the n$^+$ layer having an activation energy of 0.2 eV is used. However, the etch rate of the n$^+$ layer has a value almost twice as large as that of such a case. Further, the n$^+$/i selectivity is almost doubly improved. As the reason for these results, the following is considered: Etching is promoted in the n$^+$ layer having an activation energy of 0.1 eV because electrons of reacting molecules (radical) and those of silicon are exchanged. Accordingly, the etching is smoothly conducted and the etch rate is increased, thereby obtaining the excellent selectivity.

Figure 7:
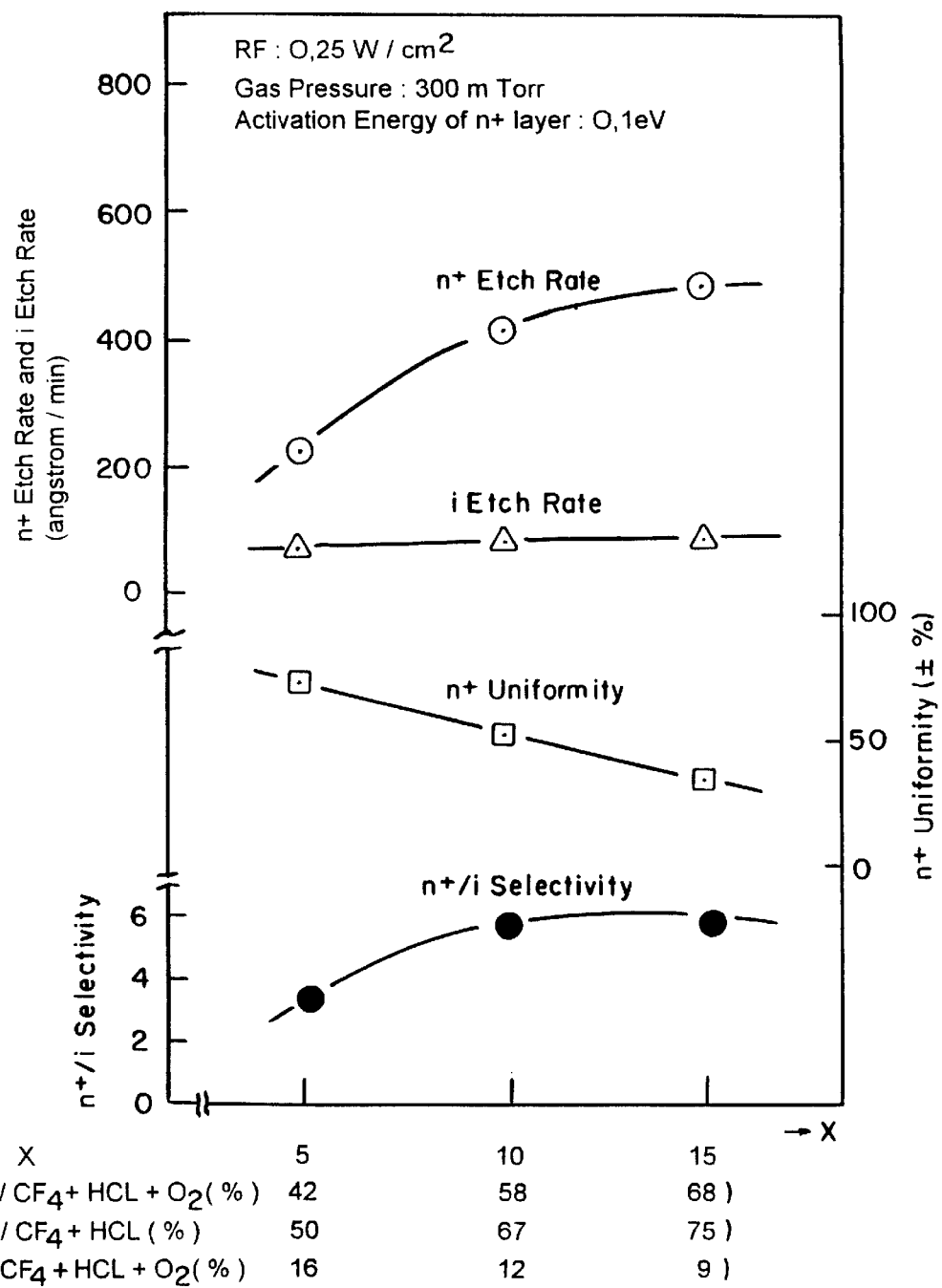
FIG. 7 is a diagram showing dependence of the $n^+/i$ selectivity, the uniformity of the etch rate of an $n^+$ layer, and the etch rates of the $n^+$ layer and the i layer, upon the concentration (mol %) of freon gas in an etching gas, in the case where the i layer and the $n^+$ layer having an activation energy of 0.1 eV are etched by a method of the invention.

FIG. 7 shows the dependence of n$^+$/i selectivity, the n$^+$ uniformity, and the etch rates of the n$^+$ layer and i layer, on the concentration (mol %) of freon-14 gas under the same measurement conditions as those of FIG. 5, excepting that an n$^+$ layer having an activation energy of 0.1 eV is used.

As is understood from this diagram, the dependence represent the same tendencies as those of the case where the n$^+$ layer having an activation energy of 0.2 eV is used. However, the n$^+$/i selectivity has further improved compared with that case.

Accordingly, excellent etching characteristics can be obtained by using a silicon thin film having an activation energy of 0.2 eV or less for the n$^+$ layer.

The TFT is fabricated by using the above-mentioned respective etching characteristics in the following manner:

The i layer 7 is deposited on the substrate with a thickness of 500 angstroms and the n$^+$ layer having an activation energy of 0.2 eV is deposited thereon with a thickness of 500 angstroms. An etching gas including hydrogen chloride gas, freon-14 gas and oxygen gas having the flow ratio of 5:15:2 and a pressure of 400 m Torr is made to flow into the dry etching apparatus. The RF electrical density is sat at 0.25 W/cm$^2$. As is apparent from FIGS. 4 and 5, the etch rate of the n$^+$ layer is 250 angstroms/min under the above-mentioned conditions. Thus, in order to divide the n$^+$ layer into the drain region 5 and the source region 6 by etching, the n$^+$ layer should be etched for about 2 minutes. For the fabrication of the TFT, etching is conducted for about 3 minutes in order to remove the active layer formed in the i layer by the diffusion of phosphorus included in the n$^+$ layer, resulting in a 150% etching of an appropriate etching. Under the above-mentioned conditions, the n$^+$/i selectivity becomes 2, and the layers can be selectively etched. Further, the i layer 7 having a thickness of 300 angstroms is formed without remaining partially undivided on the n$^+$ layer nor being excessively etched. Further, the n$^+$ layers 5 and 6 are excellent in uniformity. A liquid crystal display device having an excellent display characteristics can be fabricated by using the TFT formed in this manner.

Further, the TFT having the same structure as mentioned above is fabricated with an n$^+$ layer made of crystallite silicon having an activation energy of 0.1 eV. As is apparent from FIGS. 6 and 7, the etch rate becomes 500 angstroms/min under the above-mentioned conditions, so that only 1 minute of etching is required to divide the n$^+$ layer into the drain region 5 and the source region 6. Also, for the fabrication of this TFT, a 150% etching is conducted in order to remove the active layer formed in the i layer by the diffusion of phosphorus included in the n$^+$ layer. Under the above-mentioned conditions, the n$^+$/i selectivity becomes 4, and the layers can be selectively etched. Further, the i layer 7 having a thickness of 200 angstroms is formed without remaining partially undivided on the n$^+$ layer nor being excessively etched. Further, the n$^+$ layers 5 and 6 are excellent in uniformity. The liquid crystal display device having an excellent display characteristics can be fabricated by using the TFT formed in this manner.

In the above-mentioned examples, a mixed gas of hydrogen chloride gas and freon-14 gas added with oxygen gas is used for the etching. However, the etching gas used for the present invention is not limited to such a mixed gas and the same effect can be obtained with a mixed gas including chloride gas instead of hydrogen chloride gas. Further, a cylindrical apparatus can be used as a dry etching apparatus for the present invention. Several kinds of modes such as a RIE (Reactive Ion Etching) mode, a PE (Plasma Etching) mode and an ECR mode can be applied for the etching mode. The dry etching method of the present invention can be applied to a TFT in which an a-SiC:H layer or an a-SiN:H layer is used as an n type silicon layer.

As is apparent from the above-mentioned descriptions, according to the present invention, the $n^+$ layer and the i layer having an satisfactory controllability of etching and an uniform etch rate can be selectively etched by the dry etching method using an etching gas including hydrogen chloride gas and freon-14 gas free from the freon regulation.

Further, a TFT having an i layer of a thin film thickness can be fabricated by taking an advantage of the above-mentioned characteristics of the present invention, so that the optical pumping current can be reduced when the TFT is turned off. In addition, the distortion of the threshold voltage penetrated when the optical pumping current is introduced into a gate insulating film can be restrained, so that a liquid crystal display device having excellent display capacities can be obtained.

Various other modifications will be apparent to and can be readily made by these skilled in the art without departing from the scope and spirit of this invention. Accordingly, it is not intended that the scope of the claims appended hereto be limited to the description as set forth herein, but rather that the claims be broadly construed.

What is claimed is:

1. A method for selectively etching a second silicon layer of a multilayer structure which includes a first silicon layer and a second silicon layer formed on the first silicon layer and doped with impurities, wherein the impurities doped in the second silicon layer are n-type impurities, wherein the second silicon layer is selectively etched by using an etching gas including a freon-14 gas and a gas selected from a group consisting of hydrogen chloride gas and chorine gas and excluding carbon tetrachloride and hydrogen bromide, and, further wherein, the concentration (mol %) of the freon-14 gas against the gross volume of the freon-14 gas and the gas selected from the group consisting of the hydrogen chloride gas and the chlorine gas and excluding carbon tetrachloride and hydrogen bromide is 67% or more.

2. A method according to claim 1, wherein the gas pressure of the etching gas is 400 m Torr or more.

3. A method according to claim 1, wherein the etching gas further includes oxygen gas.

4. A method according to claim 3, wherein the concentration (mol %) of the oxygen gas in the etching gas is 12% or less.

5. A method according to claim 3, wherein the concentration (mol %) of the freon-14 gas against the etching gas is 58% or more.

6. A method according to claim 1, wherein an activation energy of the second silicon layer is 0.2 eV or less.

7. A method according to claim 6, wherein an activation energy of the second silicon layer is 0.1 eV.

* * * * *